US009478472B2

(12) United States Patent
Hu

(10) Patent No.: US 9,478,472 B2
(45) Date of Patent: Oct. 25, 2016

(54) SUBSTRATE COMPONENTS FOR PACKAGING IC CHIPS AND ELECTRONIC DEVICE PACKAGES OF THE SAME

(71) Applicant: Dyi-Chung Hu, Chutung (TW)

(72) Inventor: Dyi-Chung Hu, Chutung (TW)

( * ) Notice: Subject to any disclaimer, the term of this patent is extended or adjusted under 35 U.S.C. 154(b) by 2 days.

(21) Appl. No.: 14/281,733

(22) Filed: May 19, 2014

(65) Prior Publication Data

US 2015/0334823 A1    Nov. 19, 2015

(51) Int. Cl.
| | | |
|---|---|---|
| *H01L 23/15* | (2006.01) | |
| *H05K 1/02* | (2006.01) | |
| *H05K 1/03* | (2006.01) | |
| *H05K 1/18* | (2006.01) | |
| *H05K 1/11* | (2006.01) | |
| *H05K 3/00* | (2006.01) | |
| *H05K 3/46* | (2006.01) | |

(52) U.S. Cl.
CPC ............. *H01L 23/15* (2013.01); *H05K 1/0271* (2013.01); *H05K 1/0284* (2013.01); *H05K 1/0306* (2013.01); *H05K 1/111* (2013.01); *H05K 1/112* (2013.01); *H05K 1/181* (2013.01); *H05K 3/0052* (2013.01); *H01L 2224/16225* (2013.01); *H01L 2924/15311* (2013.01); *H05K 3/4605* (2013.01); *H05K 2201/068* (2013.01); *H05K 2201/0909* (2013.01); *H05K 2201/09154* (2013.01)

(58) Field of Classification Search
CPC ....................................................... H05K 3/445
USPC ........................................ 174/262, 264, 266
See application file for complete search history.

(56) References Cited

U.S. PATENT DOCUMENTS

| | | | | |
|---|---|---|---|---|
| 2004/0207049 A1* | 10/2004 | Bauer | ................... | H01L 21/78 257/620 |
| 2008/0246146 A1* | 10/2008 | Kodani | ................ | H05K 3/4007 257/737 |
| 2009/0211799 A1* | 8/2009 | Nagase | ................ | H05K 3/0035 174/262 |
| 2009/0308651 A1* | 12/2009 | Abe | ....................... | H05K 3/445 174/264 |
| 2012/0111726 A1* | 5/2012 | Couto Petri | ....... | G01N 27/4075 204/424 |
| 2014/0041923 A1* | 2/2014 | Hisada | ................... | H05K 1/115 174/266 |

* cited by examiner

*Primary Examiner* — Mark Tornow
(74) *Attorney, Agent, or Firm* — Hauptman Ham, LLP

(57) ABSTRACT

Substrate components for packaging IC chips and electronic device packages are disclosed. A substrate component for packaging IC chips comprises: a glass core base with at least one conductive through via connecting a combination of metallization and dielectric structures on both an upper surface and a lower surface of the glass core base; and, tapered edges created at a peripheral region of the glass core base; wherein dielectric layers are disposed over the tapered edges at the peripheral region of the glass core base. In accordance with an embodiment of the invention, the dielectric layers have a substantial planar upper surface, a lower surface conformably interfaced with the tapered edges at peripheral region of the glass core base, and a steep cutting face with the tapered edges of the glass core base. Alternatively, the tapered edges at peripheral region of the glass core base are not covered by the dielectric layers, and an encapsulated material sealing the tapered edges at peripheral region of the glass core base.

19 Claims, 6 Drawing Sheets

Figure 1A:
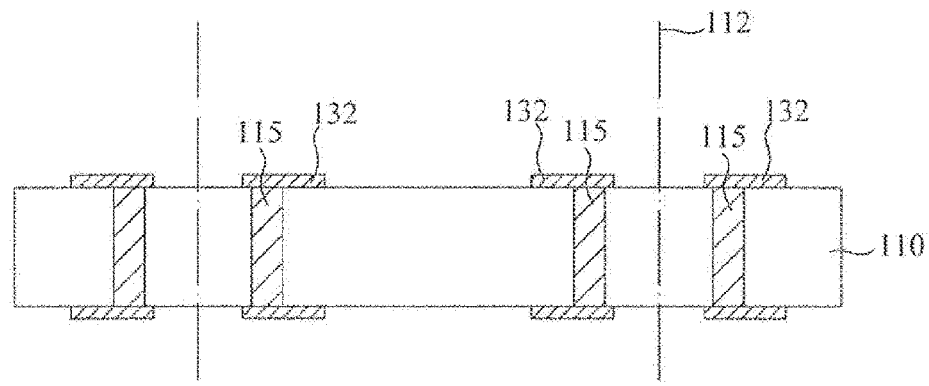

SUBSTRATE COMPONENTS FOR PACKAGING IC CHIPS AND ELECTRONIC DEVICE PACKAGES OF THE SAME

FIELD OF INVENTION

The present invention relates to electronic device packaging, and more particularly, to substrate components for packaging IC chips and electronic device packages containing the substrate component.

BACKGROUND OF THE INVENTION

Electronic device packages, particularly integrated circuit (IC) packages for consumer and industry applications are required to support the rapid growth of smart phones, tablets and other portable electronic devices. Electronic device packaging is arguably one of the most materials-intensive applications today. Package substrates also referred as chip carriers serve to protect the fragile IC chips and scale up the electrical connections while providing mechanical stability and rigidity. In some conventional applications, smaller and/or more reliably packaged devices can be fabricated, resulting in a larger number of units fabricated in parallel in the batch process.

Requirements for coefficient of thermal expansion (CTE) match between IC chip components and the chip carriers lead to a new PCB technology, particularly on glass substrates. As the proportion of dielectric materials used for build-up layer on fine patterning package substrates increases, the issue of coefficient of thermal expansion (CTE) tends to rise and stiffness is likely to decrease due to a thinner core layer. Accordingly, package warpage may increase, and chip cracks and other packaging defects are prone to occur.

Another issue is singulation. While glass substrates are not machined as easily as polymer substrate, some may be damaged during singulation. Particularly, singulation is performed by mechanical sawing.

Insofar, there is a long-felt but unmet need to develop CTE matched glass substrate component for packaging IC chips such that production of electronic device packaging can be performed easily and efficiently. The developed CTE matched glass substrate may expand the capability of the next generation packaging.

SUMMARY OF THE INVENTION

In view of the problems existing in the prior art, the present invention provides glass based substrate components for packaging IC chips so that production of electronic device packaging can be performed easily and efficiently. Sequential layer build-up (SBU) layers are formed on the glass substrate to scale up the electrical connections while providing mechanical stability and rigidity.

A substrate component for packaging IC chips comprises a glass core base with at least one conductive through via connecting a combination of metallization and dielectric structures on both an upper surface and a lower surface of the glass core base, and tapered edges created at a peripheral region of the glass core base, wherein dielectric layers are disposed over the tapered edges at the peripheral region of the glass core base.

According to an embodiment of the present invention, a substrate component for packaging IC chips comprises a glass core base with at least one conductive through via connecting a combination of metallization and dielectric structures on both an upper surface and a lower surface of the glass core base, and tapered edges created at a peripheral region of the glass core base, wherein dielectric layers are disposed over the tapered edges at peripheral region of the glass core base, wherein the dielectric layers have a substantial planar upper surface, a lower surface conformably interfaced with the tapered edges at peripheral region of the glass core base, and a steep cutting face with the tapered edges of the glass core base.

According to another embodiment of the present invention, a substrate component for packaging with IC chips comprises a glass core base with at least one conductive through via connecting a combination of metallization and dielectric structures on both an upper surface and a lower surface of the glass core base, tapered edges created at peripheral region of the glass core base, and an encapsulated material sealing the tapered edges at peripheral region of the glass core base, wherein dielectric layers are disposed over the tapered edges at peripheral region of the glass core base.

Other aspects of the present invention, part of them will be described in the following description, part of them will be apparent from description, or can be known from the execution of the present invention. For example, an electronic device package comprises a substrate component set forth above, IC chips mounted on the substrate component; and a carrier mother board for supporting the combination of the IC chips and substrate component.

BRIEF DESCRIPTION OF THE PICTURES

The foregoing aspects and many of the attendant advantages of this invention will become more readily appreciated as the same becomes better understood by reference to the following detailed description, when taken in conjunction with the accompanying pictures, wherein:

FIGS. 1A-1F are cross-sections of each stage of fabricating a substrate component for packaging IC chips according to an embodiment of the present invention; and FIGS. 2A-2E are cross-sections of each stage of fabricating a substrate component for packaging IC chips according to another embodiment of the present invention.

DETAILED DESCRIPTION OF THE INVENTION

Reference will now be made in detail to the present preferred embodiments of the invention, examples of which are illustrated in the accompanying drawings. Wherever possible, the same reference numbers are used in the drawings and the description to refer to the same or like parts. In the drawings, the shape and thickness of an embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be presented.

An embodiment of the present invention discloses a glass substrate component for packaging IC chips with reference to FIGS. 1A-1F. It should be noted that the features illustrated in the drawings are not necessarily drawn to scale, and like reference numerals represent the same or similar elements. The devices, elements, and methods in the following description are configured to illustrate the present invention, and should not be construed in a limiting sense.

FIGS. 1A-1F illustrate cross-sections of each stage of fabricating a substrate component for packaging IC chips according to an embodiment of the present invention. Referring to FIG. 1A, a glass substrate 110, preferable a 20"×20" inch square plate served as a core base of the package is provided. Alternative substrates can be comprised of ceramic, quartz, epoxy fiber-glass or polymer with fillers. The glass substrate 110 includes electrical connections 115 such as through-glass via interconnects through the glass substrate, connecting contact pads 132 and conductive traces formed on one or more surfaces of the glass substrate. The contact pads 132 configured to electrically connect the electrical connections 115 are formed on both sides of the glass substrate 110. The formation of through-glass interconnects and other metal components of a package in a single plating process stage can reduce costs per package. Through-glass via interconnects can be formed by machine drilling, laser, plasma etching, or similar methods. The glass substrate is preferably subdivided into an array of packaging areas with predetermined kerf lines 112 spreading therebetween.

Figure 1B:
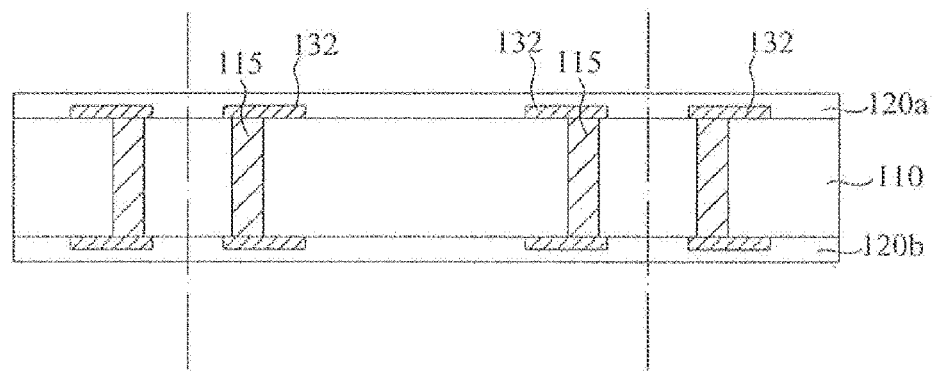
Figure 1C:
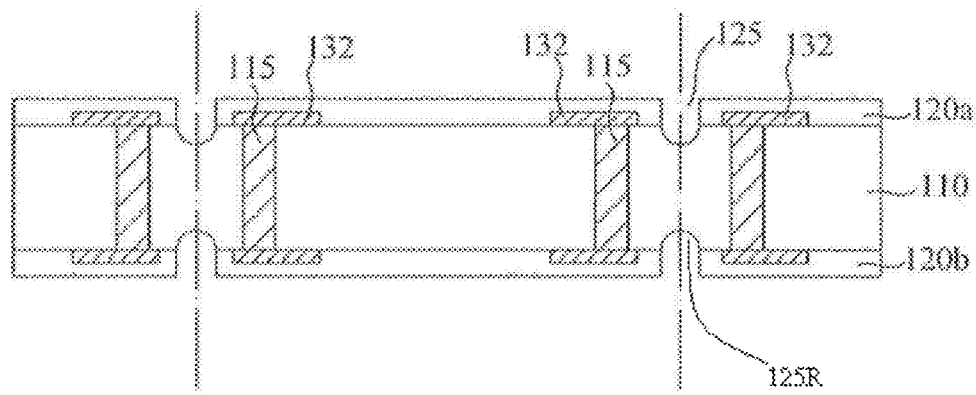

Referring to FIG. 1B, dry films 120a, 120b or photoresist layers are formed on both sides of the glass substrate. Subsequently, the dry films are patterned creating a grid of openings which exposes the kerf line regions. Trenches or recesses 125R are formed by etching and thinning the glass substrate, as shown in FIG. 1C. The shape of trenches or recesses 125R includes curved, stepped or wedged shapes.

Figure 1D:
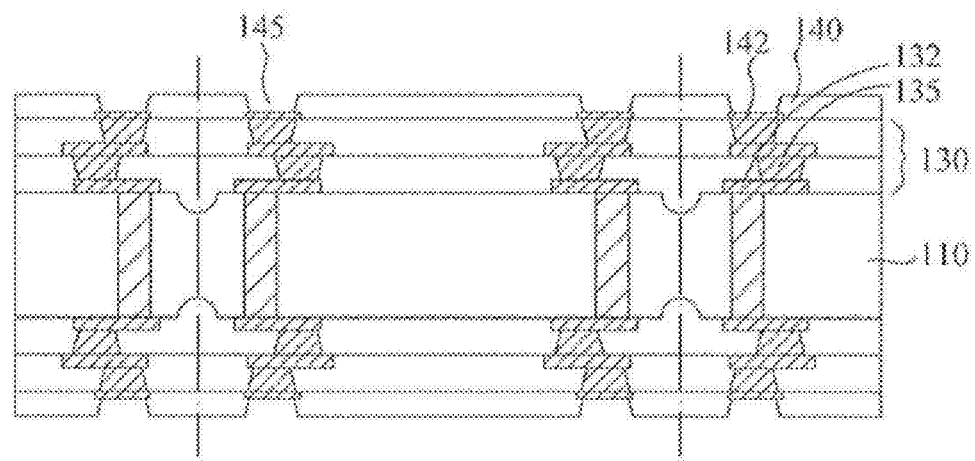

Referring to FIG. 1D, sequential layer build-up (SBU) layers 130 start as the double sided glass substrate 110, with conductive and dielectric layers formed one after the other (using multiple lamination passes), on both sides of the glass substrate 110. Additional layers are laminated onto either side. This technology allows blind vias 135 to be created during the build-up process, and discrete or formed components to be embedded. Build-up layers are characterized by copper trace 132 dimensions such as width, thickness, and spacing. It's a common buildup structure that build up layer at each side of core base. It can improve wiring density by stacked via structure on buildup layer. Solder mask layers 140 with openings 145 exposing solder pads 142 are applied on the sequential layer build-up (SBU) layers 130.

Metallization can include formation of any of conductive routing 132, through-dielectric via interconnects 135 and solder pads 142, on one or more surfaces on the glass substrate. In some embodiments, a solder pad 142 includes a solderable metallurgy. Examples of solderable metallurgies include nickel/gold (Ni/Au), nickel/palladium (Ni/Pd), nickel/palladium/gold (Ni/Pd/Au), etc. In some embodiments, a joining pad includes a solder paste or preform. For example, a solder paste or preform can be printed on top of a solder pad including a solderable metallurgy.

Figure 1E:
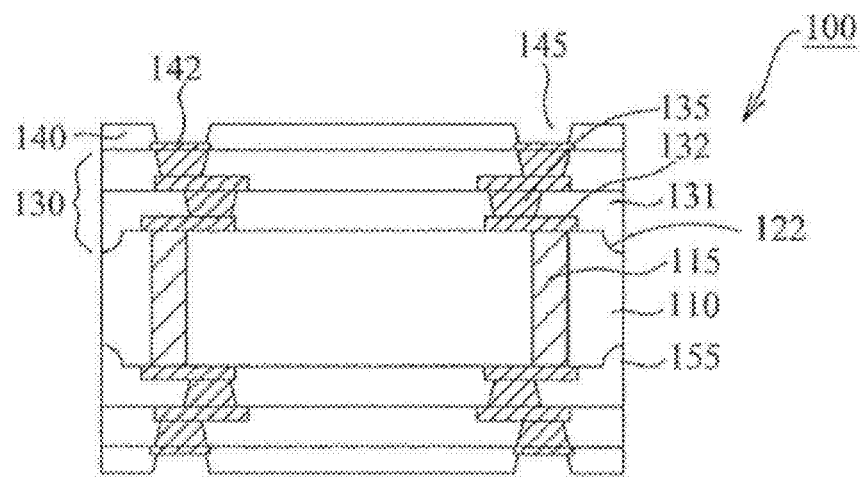

Referring to FIG. 1E, singulation is the act of separating multiple devices manufactured on a substrate from each other by creating a cut or break along the kerf lines to form individual substrate component for packaging IC chips. Singulation can be performed in many ways. Scribing/breaking, followed by mechanically breaking or cleaving to separate the die is accomplished by machining a cut or trench in the surface of the substrate. This cut or trench can be formed by mechanical sawing, chemical etching, laser radiation or a combination. Another ways to singulate substrates are performed by mechanical sawing, chemical etching or laser radiation or a combination, without mechanical cleaving.

According to one embodiment of the invention, a singulated substrate component 110 for packaging IC chips comprises a glass core base 110 with at least one conductive through via 115 connecting a combination of metallization 132, 135 and dielectric structures 131 on both an upper surface and a lower surface of the glass core base. Tapered edges 122 are created at a peripheral region of the glass core base 110, wherein dielectric layers 131 are disposed over the tapered edges at peripheral region of the glass core base, wherein the dielectric layers have a substantial planar upper surface, a lower surface conformably interfaced with the tapered edges at peripheral region of the glass core base, and a steep cutting face 155 with the tapered edges of the glass core base.

Figure 1F:
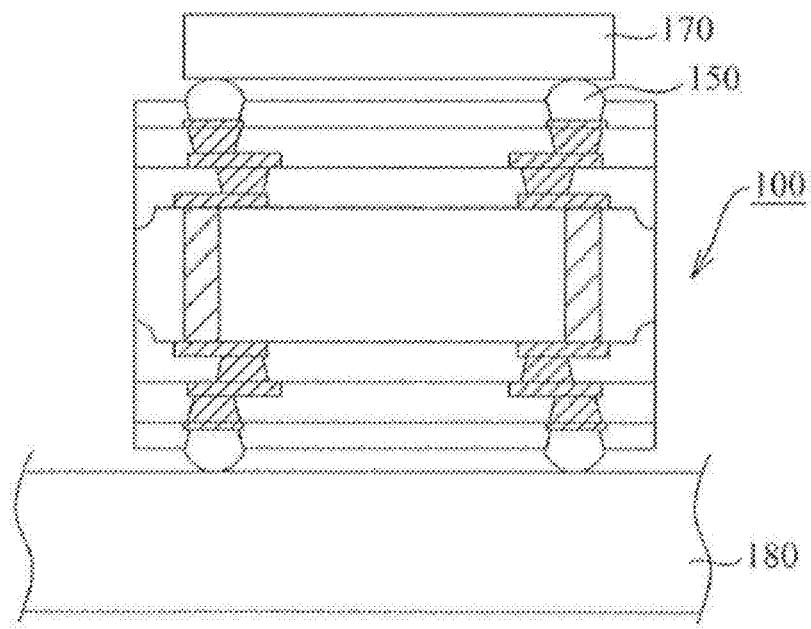

Referring to FIG. 1F, the substrate component 100 with glass substrate package structure also can include solder pads 142 and solder balls 150 for mounting silicon chips (silicon devices) on an exterior surface of the package substrate. The solder pads 142 and solder balls 150 can be electrically connected to a device such as IC chips 170 disposed overlying the glass substrate. IC chips are mounted on the substrate component to create a chip package structure. In some embodiments, the chip package structure is configured for direct mounting on a carrier mother board 180 such as a printed circuit board (PCB) for supporting the combination of the IC chips and substrate component. The chip package structure of the present invention can accommodate one or more dies with similar or different functions. The external circuitry of the thin-film circuit layer electrically connects the multiple dies together and can be used in a multi-chip module (MCM) package. The chip package structure of the present invention adapts the MCM, the external circuitry of the thin-film circuit layer, the passive devices of the external circuitry to form a package that is "system in package".

Figure 2A:
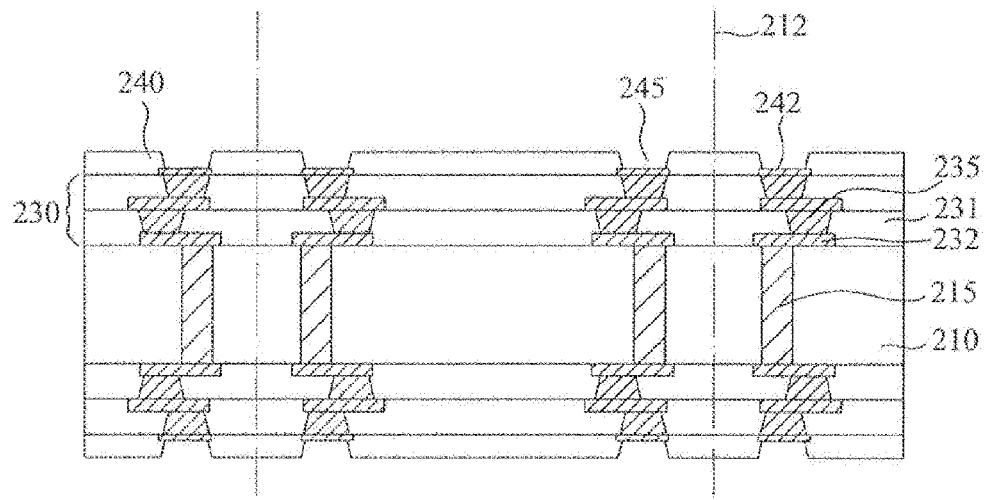

Another embodiment of the present invention discloses substrate components for packaging IC chips with reference to the FIGS. 2A-2E. Referring to FIG. 2A, a glass substrate 210, preferable a 20"×20" inch square plate served as a core base is provided. Alternative substrates can be comprised of ceramic, glass or glass-like material. The glass substrate 210 includes electrical connections 215 such as through-glass via interconnects through the glass substrate, connecting contact pads 232 and conductive traces formed on one or more surfaces of the glass substrate. The contact pads 232 configured to electrically connect the electrical connections 215 are formed on both sides of the glass substrate 210. The glass substrate is preferably subdivided into an array of packaging areas with predetermined kerf lines 212 spreading therebetween.

Sequential layer build-up (SBU) layers 230 start as the double sided glass substrate 210, with conductive and dielectric layers formed one after the other (using multiple lamination passes), on both sides of the board. This technology also allows connections 232 and vias 235 to be created during the build-up process, and discrete or formed components to be embedded. Build-up layers are characterized by copper trace dimensions such as width, thickness, and spacing. It's a common buildup structure that build up layer at each side of core layer. It can improve wiring density by stacked via structure on buildup layer. High density interconnect technology has a higher wiring density per unit area than a conventional PCB. Solder resist layers 240 with openings 245 exposing solder pads 242 are applied on the sequential layer build-up (SBU) layers 230.

Metallization can include formation of any of conductive routing 232, through-dielectric via interconnects 235 and solder pads 242, on one or more surfaces on the glass substrate. In some embodiments, a solder pad 242 includes a solderable metallurgy. Examples of solderable metallurgies include nickel/gold (Ni/Au), nickel/palladium (Ni/Pd), nickel/palladium/gold (Ni/Pd/Au), etc. In some embodiments, a joining pad includes a solder paste or preform. For example, a solder paste or preform can be printed on top of a solder pad including a solderable metallurgy.

Figure 2B:
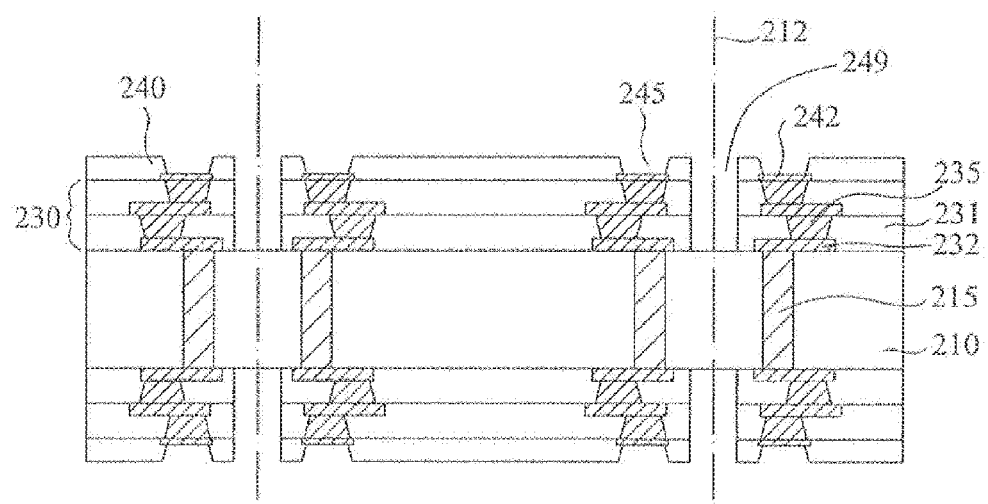
Figure 2C:
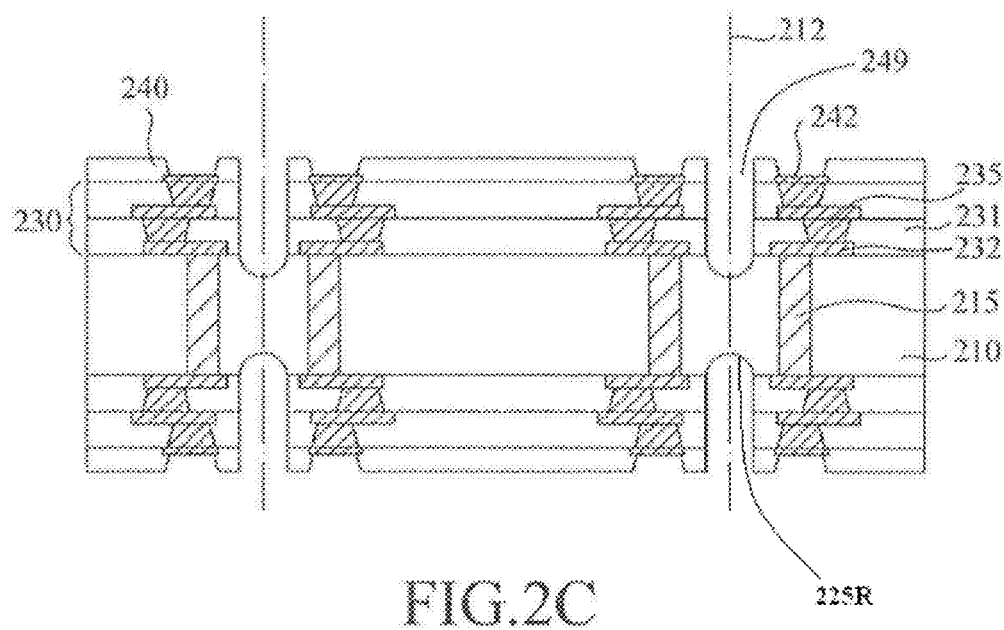

Referring to FIG. 2B, dry films or photoresist are formed over both sides of the sequential layer build-up (SBU) layers 230 and the solder resist layers 240. The SBU layers 230 and the solder resist layers 240 are sequentially patterned creating grid of openings 249 exposing the kerf line regions. The openings 249 can be created by laser removal or mechanical removal. Recesses or trenches 225R are further formed by etching and thinning the glass substrate, as shown in FIG. 2C. The shape of recesses or trenches 225R includes curved, stepped or wedged shapes.

Figure 2D:
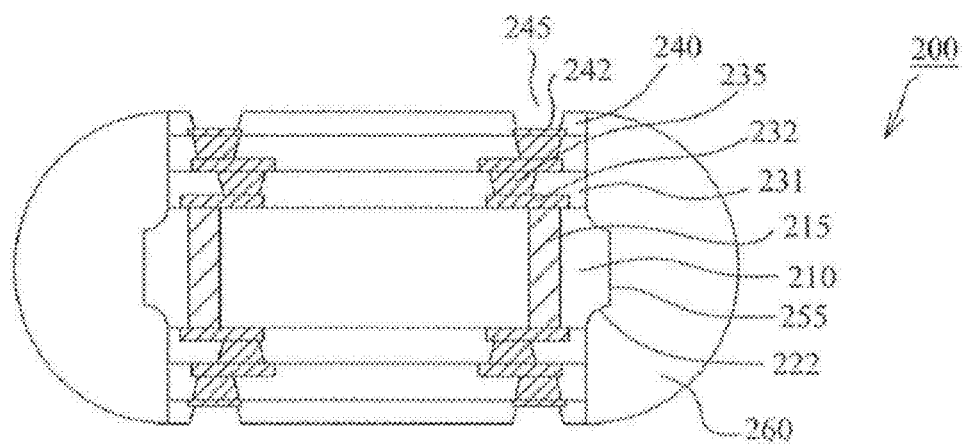

Referring to FIG. 2D, singulation is the act of separating multiple devices manufactured on a substrate from each other by creating a cut or break along the kerf lines to form individual substrate component for packaging IC chips. Singulation can be performed in many ways. For example, scribing/breaking or separation is accomplished by mechanical sawing, chemical etching or laser radiation or a combination, without mechanical cleaving.

According to another embodiment of the invention, a substrate component 200 for packaging with IC chips comprises a glass core base 210 with at least one conductive through via 215 connecting a combination of metallization 232, 235 and dielectric structures 231 on both an upper surface and a lower surface of the glass core base. Tapered edges 222 of a protrusion 255 of the glass core base 210 are created at peripheral region of the glass core base. An encapsulated material 260 is applied sealing the tapered edges 222 of the protrusion 255 at the peripheral region of the glass core base.

Figure 2E:
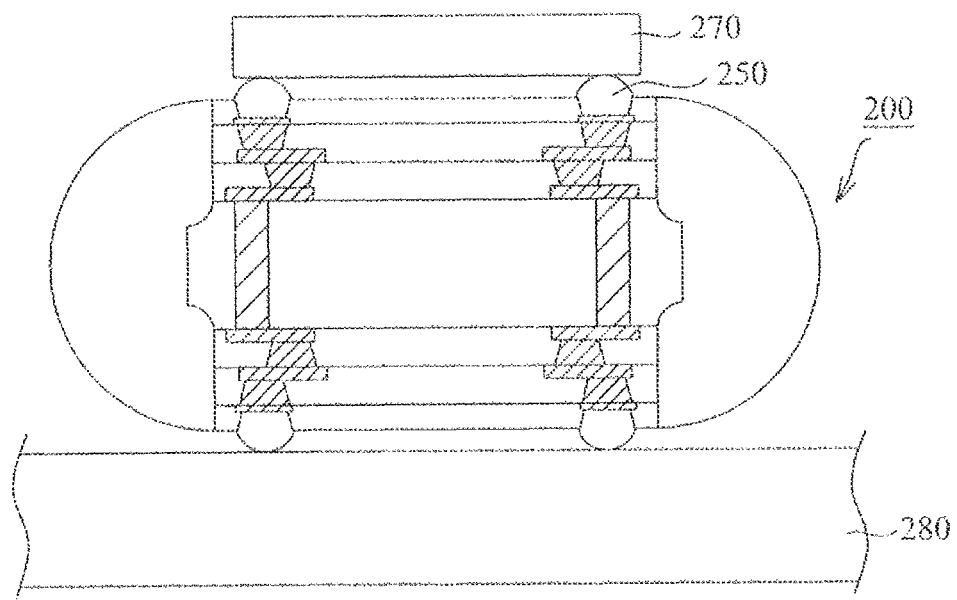

Referring to FIG. 2E, the substrate component 200 with glass substrate package structure also can include solder pads 242 and solder balls 250 for surface mount device (SMD) on an exterior surface of the package substrate. The solder pads 242 and solder balls 250 can be electrically connected to a device such as IC chips 270 disposed overlying the glass substrate. IC chips are mounted on the substrate component to create a chip package structure. In some embodiments, the chip package structure is configured for direct mounting on a carrier mother board 280 such as a printed circuit board (PCB) for supporting the combination of the IC chips and substrate component.

While the invention has been described by way of examples and in terms of preferred embodiments, it would be apparent to those skilled in the art to make various equivalent replacements, amendments and modifications in view of specification of the invention. Therefore, the scope of the appended claims should be accorded the broadest interpretation so as to encompass all such replacements, amendments and modifications without departing from the spirit and scope of the invention.

What is claimed is:

1. A substrate for packaging IC chips, the substrate comprising:
   a core base;
   at least one conductive through via passing through the core base;
   a metallization structure embedded in dielectric layers, wherein the metallization structure and the dielectric layers are configured on a top surface of the core base;
   a plurality of bonding pads configured on a top surface of the metallization structure; and
   a tapered edge at an outermost periphery of the core base;
   wherein
   the core base is made of a material selected from the group consisting of glass, ceramic, quartz, epoxy fiberglass, and polymer with fillers,
   the tapered edge extends downwardly and outwardly from the top surface of the core base to a side surface of the core base,
   the dielectric layers have side surfaces connected to the tapered edge of the core base along the outermost periphery of the core base, and
   the side faces of the dielectric layers and the tapered edge and the side face of the core base are free of conductive material along the outermost periphery of the core base in cross section.

2. The substrate as claimed in claim 1, wherein
   a dielectric material of the dielectric layers is in direct physical contact with the tapered edge of the core base, and
   each side of the dielectric layers which embed the metallization structure is flush with a corresponding side of the core base.

3. The substrate as claimed in claim 2, wherein the tapered edge has a shape, in section view, selected from the group consisting of curved, stepped, and wedged shapes.

4. The substrate as claimed in claim 3, further comprising: a chip configured on top of the plurality of bonding pads.

5. The substrate as claimed in claim 1, wherein the tapered edge is protruded beyond the dielectric layers which embed the metallization structure.

6. The substrate as claimed in claim 5, further comprising: an encapsulated material covering and in direct physical contact with the tapered edge.

7. The substrate as claimed in claim 6, wherein the tapered edge has a shape, in section view, selected from the group consisting of curved, stepped, and wedged shapes.

8. The substrate as claimed in claim 5, further comprising: a chip configured on top of the plurality of bonding pads.

9. A process for fabricating a substrate for packaging IC chips, the process comprising:
   forming a first recess or trench in a first surface of a core base along a kerf line;
   forming a first metallization structure on the first surface of the core base, wherein the first metallization structure is embedded in first dielectric layers;
   forming a plurality of first bonding pads on the first metallization structure; and
   singulating the core base along the kerf line to obtain the substrate which comprises:
   the core base;
   at least one conductive through via passing through the core base;
   the first metallization structure embedded in the first dielectric layers, wherein the first metallization structure and the first dielectric layers are configured on a top surface of the core base;
   the plurality of first bonding pads configured on a top surface of the first metallization structure; and
   a first tapered edge at an outermost periphery of the core base, the first tapered edge corresponding to a side wall of the first recess or trench,
   wherein the core base is made of a material selected from the group consisting of glass, ceramic, quartz, epoxy fiber-glass, and polymer with fillers, the tapered edge extends downwardly and outwardly from the top surface of the core base to a side surface of the core base, the dielectric layers have side surfaces connected to the tapered edge of the core base along the outermost periphery of the core base, and the side faces of the dielectric layers and the tapered edge and the side face of the core base are free of conductive material along the outermost periphery of the core base in cross section.

10. A process as claimed in claim 9, wherein a dielectric material of the first dielectric layers is filled in the first recess or trench, and is in direct physical contact with the first tapered edge of the core base, and said singulating includes cutting through the dielectric material filled in the first recess or trench.

11. A process as claimed in claim 9, further comprising:

forming a second recess or trench on a second surface of the core base along the kerf line;

forming a second metallization structure on the second surface of the core base, wherein the second metallization structure is embedded in second dielectric layers; and forming a plurality of second bonding pads on the second metallization structure, wherein the first surface and the second surface are opposite surfaces of the core base, the second recess is aligned with the first recess along the kerf line, a dielectric material of the first dielectric layers is filled in the first recess or trench, a dielectric material of the second dielectric layers is filled in the second recess or trench, and said singulating includes cutting through the dielectric material filled in the first recess or trench, and through the dielectric material filled in the second recess or trench to form the first tapered edge at the outermost periphery of the core base, the first tapered edge in direct physical contact with the dielectric material of the first dielectric layers, and a second tapered edge at the outermost periphery of the core base, the second tapered edge corresponding to a side wall of the second recess or trench and in direct physical contact with the dielectric material of the second dielectric layers.

12. A process as claimed in claim 9, further comprising:

removing the first dielectric layers along the kerf line to expose the first surface of the core base;

wherein said forming the first recess or trench comprises, after said removing, forming the first recess or trench in the exposed first surface of the core base along the kerf line.

13. A process as claimed in claim 12, further comprising:

forming a second metallization structure on a second surface of the core base, wherein the second metallization structure is embedded in second dielectric layers;

forming a plurality of second bonding pads on the second metallization structure;

removing the second dielectric layers along the kerf line to expose the second surface of the core base; and forming a second recess or trench in the exposed second surface of the core base along the kerf line, wherein the first surface and the second surface are opposite surfaces of the core base, the second recess is aligned with the first recess along the kerf line, and said singulating includes cutting through a portion of the core base exposed by the first recess or trench on one side, and exposed by the second recess or trench on an opposite side.

14. A substrate for packaging IC chips, the substrate comprising:

a core base having a tapered edge at an outermost periphery of the core base;

at least one conductive through via passing through the core base;

a sequential layer build-up structure configured on a top surface of the core base, wherein the sequential layer build-up structure comprises:

dielectric layers, and a metallization structure embedded in the dielectric layers and electrically connected to the at least one conductive through via; and a plurality of bonding pads configured on a top surface of the sequential layer build-up structure and electrically connected to the metallization structure, wherein the tapered edge extends downwardly and outwardly from the top surface of the core base to a side surface of the core base, a dielectric material of the dielectric layers is in direct physical contact with the tapered edge of the core base, and has a side surface flush with the side surface of the core base, and the side surface of said dielectric material and the side surface of the core base are exposed to the atmosphere along the outermost periphery of the core base.

15. The substrate as claimed in claim 14, wherein the sequential layer build-up structure has a side surface flush with the side surface of the core base.

16. The substrate as claimed in claim 14, wherein the core base has a further taper edge at the outermost periphery of the core base, said further taper edge extending upwardly and outwardly from a bottom surface of the core base to the side surface of the core base, and the taper edges of the core base are aligned with each other.

17. The substrate as claimed in claim 14, wherein the core base is made of a material selected from the group consisting of glass, ceramic, quartz, epoxy fiberglass, and polymer with fillers, and the tapered edge has a shape, in section view, selected from the group consisting of curved, stepped, and wedged shapes.

18. A substrate for packaging IC chips, the substrate comprising:

a core base having a tapered edge;

at least one conductive through via passing through the core base;

a sequential layer build-up structure configured on a top surface of the core base, wherein the sequential layer build-up structure comprises:

dielectric layers, and a metallization structure embedded in the dielectric layers and electrically connected to the at least one conductive through via;

a plurality of bonding pads configured on a top surface of the sequential layer build-up structure and electrically connected to the metallization structure; and an encapsulated material covering and in direct contact with the tapered edge, wherein the tapered edge extends downwardly and outwardly from the top surface of the core base to a side surface of the core base, wherein the tapered edge protrudes outwardly beyond a corresponding side surface of the sequential layer build-up structure, and the encapsulated material covers and is in direct contact with the side surface of the core base, and the corresponding side surface of the sequential layer build-up structure.

19. The substrate as claimed in claim 18, wherein the core base is made of a material selected from the group consisting of glass, ceramic, quartz, epoxy fiberglass, and polymer with fillers, and the tapered edge has a shape, in section view, selected from the group consisting of curved, stepped, and wedged shapes.

\* \* \* \* \*